United States Patent [19]

Kriman et al.

[11] Patent Number: 4,962,410
[45] Date of Patent: Oct. 9, 1990

[54] QUADFET-A NOVEL FIELD EFFECT TRANSISTOR

[75] Inventors: Alfred M. Kriman, Tempe, Ariz.; Gary H. Bernstein, South Bend, Ind.

[73] Assignee: Arizona Board of Regents, Tempe, Ariz.

[21] Appl. No.: 389,760

[22] Filed: Aug. 4, 1989

[51] Int. Cl.⁵ .......................................... H01L 29/80
[52] U.S. Cl. .......................................... 357/22; 357/4; 357/23.7; 357/15
[58] Field of Search ......... 357/4, 23.7, 22 A, 22 MD, 357/22 I, 15

[56] References Cited

U.S. PATENT DOCUMENTS

| 4,000,368 | 11/1987 | Yoder | 357/22 |
| 4,740,823 | 4/1988 | Thompson | 357/30 |
| 4,748,484 | 5/1988 | Takakuwa et al. | 357/22 |

FOREIGN PATENT DOCUMENTS

| 57-7163 | 1/1982 | Japan | 357/22 |
| 58-201375 | 11/1983 | Japan | 357/15 |
| 63-161677 | 7/1988 | Japan | 357/22 |

Primary Examiner—Andrew J. James
Assistant Examiner—Don Monin
Attorney, Agent, or Firm—Richard R. Mybeck

[57] ABSTRACT

A quantum diffraction field effect transistor ("QUAD-FET"), a new class of semiconductors which exploits the phenomenon of electron diffraction to produce novel circuit characteristics.

15 Claims, 3 Drawing Sheets

QUADFET-A NOVEL FIELD EFFECT TRANSISTOR

INTRODUCTION

This invention relates to semiconductor devices and more particularly to a quantum diffraction field effect transistor ("QUADFET"), a new class of semiconductor devices which exploits the phenomenon of electron diffraction to produce novel circuit characteristics.

BACKGROUND OF THE INVENTION

The wave/particle duality of electrons is an important aspect of quantum mechanical descriptions of their behavior. Most simple descriptions of electrons refer only to their particle nature, with discussions of the wave nature reserved for considerations of physical features on the order of a few tens of nanometers.

The Schrödinger equation describes the motion of an electron as the evolution of a wave extended in space. Some examples of phenomena which depend upon the wave nature of electrons are the Ramsauer-Townsend effect, Fresnel diffraction from a sharp boundary and diffraction from an electrostatic double prism. See H. Haken and H. C. Wolf, *Atomic and Quantum Physics*, (Springer-Verlag, New York, 1984). Diffraction of electrons has been applied in such analytical techniques as Low Energy Electron Diffraction Spectroscopy (LEEDS) and Reflection High Energy Electron Diffraction (RHEED). See M. G. Lagally, "Low Energy Electron Diffraction," in *Metals Handbook ninth edition*. vol. 10, 536, edited by R. E. Whan, American Society for Metals, Metals Park, Ohio (1986).

All of the effects noted above were observed in vacuum. Most solid state electron devices exhibit essentially particle-like behavior, with their wave nature entering the analysis only through a band structure computation. Direct observation of electron wave phenomena is possible only in devices having feature sizes comparable to characteristic electron wavelengths. Such devices have been developed using new epitaxial growth and lithographic techniques. Prominent examples are the Resonant Tunneling diode, R. Tsu and L. Esaki, "Tunneling in a finite superlattice", Appl. Phys. Lett. 22. 562 (1973); and small rings for observing the Aharonov-Bohm effect. S. Datta et al., Phys. Rev. Lett., 55 (21), 2344 (1985). In these devices, current oscillations arise from constructive and destructive interference of electron waves. The Aharonov-Bohm experiments demonstrate that effects can be observed which require phase coherence on the scale of a micron.

Some solid state devices exist which exhibit electron interference, but none exhibit diffraction. The QUADFET of this invention will enable Fraunhofer diffraction to be demonstrated and exploited. These devices are High Electron Mobility Transistors (HEMTs), in which the source and a specially-formed drain perform the functions of the light source and "viewing screen" of an analogous optical system, respectively. A device has been proposed which utilizes electron diffraction, but whose construction differs markedly from that of the device of the present invention. See K. Furuya, J. Appl. Phys. 62 (4), 15 Aug. 1987.

SUMMARY OF THE INVENTION

The present invention provides a novel quantum diffraction field effect transistor (QUADFET) which exploits the phenomenon of electron diffraction to produce novel electrical characteristics.

In the quantum diffraction field effect transistor of this invention, the gate of a High Electron Mobility Transistor ("HEMT") is replaced with a short gate that has an opening or slit at its center, and the drain is a collection of a plurality of Schottky contacts or fingers which are arranged with their tips on an arc of a circle centered at the slit. The source and specially-formed drain perform the function of the light source and "viewing screen" of an analogous optical system, respectively.

The term "HEMT", as used herein, refers to a high electron mobility transistor.

The term "FET" refers to field effect transistor.

The term "QUADFET" refers to a quantum diffraction field effect transistor.

BRIEF DESCRIPTION OF DRAWINGS

In the drawings:

FIG. 5 is a graph depicting angular current density for a 150 nm slit, drain source potential of 0.1 mV, and electron current densities $10^{11}$ cm$^{-2}$ and $10^{-12}$ cm$^{-2}$;

FIG. 6 is a graph depicting the angular current density (normalized) in the collimating-gate QUADFET of FIG. 3;

FIG. 7 is a graph depicting the current density at a diffraction angle $\Theta=45°$, for an electron density $3\times10^{11}$ cm$^{-2}$, as a function of slit width;

DETAILED DESCRIPTION OF PREFERRED EMBODIMENTS

Figure 1:
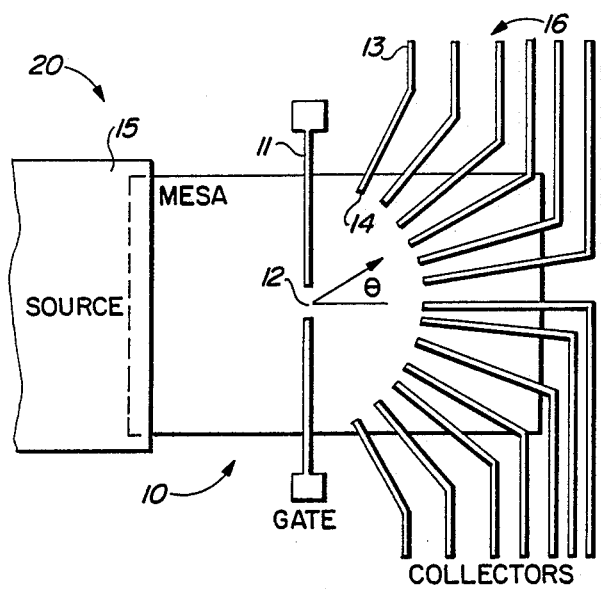
FIG. 1 is a top view of a simple QUADFET of the present invention.

Referring to FIG. 1, in its simplest embodiment, QUADFET 10 is a short gate HEMT with major modifications. Gate 11 is split, having an opening or "slit" 12 at its center, on the order of 100 nm wide. In practice, the width of the slit may be varied from between 40 to 400 nanometers. The gate is preferably made as short as possible to provide a high speed operation and high transmission through the slit. As with light, the ratio of slit width to electron wavelength is a controlling parameter for diffraction effects. In this device, the slit width, and thus the diffraction pattern, can be adjusted electronically. The slit width is just the size of the conducting region between the edges of the depletion region beneath the split gate, so increasing the reverse bias on the gate decreases the slit width.

The drain 16 is a collection of many forward-biased Schottky contacts 13. These charge-collecting contacts or "fingers" 13 are arranged with their tips 14 on an arc of circle centered at the slit 12. In the usual optical arrangement, the viewing screen is planar. In QUADFET 10, the semi-circular pattern is used to improve collection efficiency for large-angle diffraction lobes. At a distance of one micron from the slit, the fingers are close enough to receive ballistic electrons. With the 50 nm pitch achievable by specialized electron beam lithography techniques, finger tips at one micron have an angular resolution of about 3 degrees.

In practice, electrons leaving the source pass through the slit where they are diffracted toward the collecting fingers with a strong angular dependence.

Figure 4:
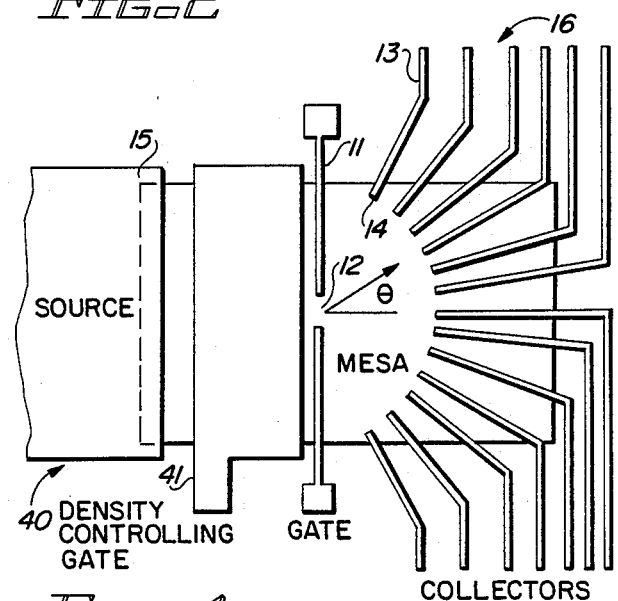
FIG. 4 is a top view of a QUADFET in accordance with the present invention which additionally comprises a second, density-controlling gate.

In the single-slit QUADFET of FIG. 1, there is no angular collimation, but adjustment of the density and drain-source bias monochromates the incident electrons. Electron density may be adjusted by means of an additional gate 41, best shown in FIG. 4. This density-control gate must be large enough to effectively lower the quasi-Fermi level, and close enough to the slit 12 to deliver electrons ballistically.

Figure 2:
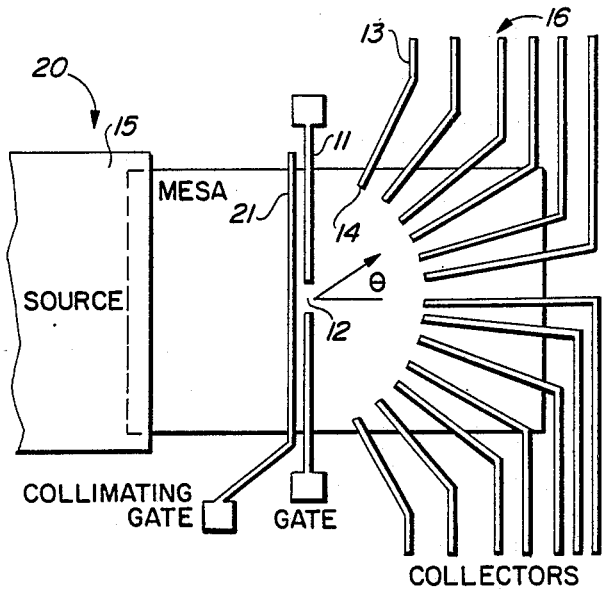
FIG. 2 is a top view of a collimating gate QUADFET in accordance with the present invention.

The current through the slit was found by solving the Schrödinger equation for a very thin gate that is perfectly reflecting away from the slit. The results of the simulations for a 150 nm slit and electrons in GaAs are shown in FIG. 5. In FIG. 5, the current density is plotted as a function of angle at two electron densities. At the higher density, there are several discernible minima. At the lower density, the longer Fermi wavelength distribution leads to features which are moved out in an angle. The important conclusion can be drawn that with a sufficiently high density, a diffraction pattern can be observed even without angular collimation. It is nevertheless possible to focus the incident electrons by use of a collimating gate 21 (FIG. 2), a thin gate running parallel and close to the slit gate 11, on its source side. The bias on this gate can be adjusted to pass only electrons with high momentum perpendicular to the gate. This can be used to trim the Fermi distribution into a focused distribution with a total wavelength equal to the Fermi wavelength.

Referring to FIG. 6, the current profile is plotted for QUADFET 20. This pattern is much sharper than that of QUADFET 10 (FIG. 1). Similar collimation should be obtainable by use of a long gate. The slit becomes an electron waveguide, and the waveguide cutoff collimates the electrons. A disadvantage of collimation, however, is low current, since the phase space density of electrons is bounded by $4/h^2$ (h=Planck's constant).

The nth maximum is given approximately by $(a/\lambda) \sin\Theta = n+$, where $a$ is the slit width, $\lambda$ is the wavelength of the incident electrons. Fingers can be chosen which are turned on or off in complementary response to the input voltage (which controls $a$), allowing the formation of a low-power gate. Complementary logic may thus be made with QUADFETs in place of MOSFETs used in CMOS. Advantages are small size, a reduced number of fabrication steps, and the inherent high speed of ballistic transport.

Ramping the gate bias gives rise to an oscillatory transconductance. This is best illustrated in FIG. 7 where the current density is plotted for a fixed angle as a function of slit width. The oscillatory characteristic makes possible a versatile frequency multiplier. For large angles or large input (gate) voltage amplitudes, one cycle of gate voltage can correspond to many cycles of output (finger) current. The output has a dominant component at an adjustable frequency, unlike ordinary frequency multipliers, in which the output power is typically shared by a range of harmonics and the output signal must be selected by filtering. Since the device is ballistic and can operate at high frequencies, multiplied frequencies could range into the terahertz under proper conditions of bias, density and angle.

Additionally, the novel QUADFETs of this invention may be used as magnetic field sensors. A magnetic field applied perpendicular to the plane of the device curves the electron trajectories, shifting and deforming the current pattern detected at the drain fingers.

Furthermore, QUADFETs may be used as analog-to-digital (A/D) converters. FIG. 7 suggests that local maxima and minima at the individual collectors can represent ones and zeros. These bits form a digital code of the analog input. Since a voltage swing at the gate shifts the positions of these local maxima, a given gate voltage will correspond to a unique pattern of ones and zeros, and could be further processed by a high speed lookup table. In this manner, a single QUADFET could replace all of the functions of a simple A/D converter (assuming that the required number of bits does not exceed the number of inner lobes) and perform the task at a much higher rate than that of conventional A/D circuits. This exemplifies the notion of the multifunctionality of quantum devices.

Figure 8:
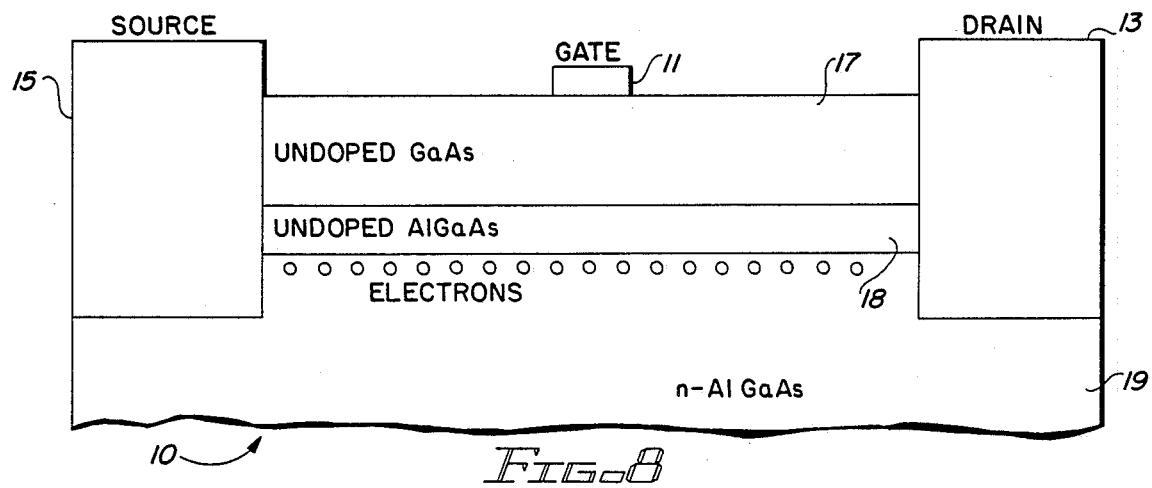
FIG. 8 is a section view of a the body of a simple QUADFET in accordance with the present invention after alloying.

Referring to FIG. 8, in the preferred embodiment, the device may best be described as a HEMT whose drain has been replaced by fingers 13. QUADFET 10 is fabricated from a typical modulation doped heterostructure material commonly employed for HEMTs. In one embodiment, gate 11 is carried on the surface of undoped GaAs first semiconductor layer 17. An undoped $al_{0.3}Ga_{0.7}As$ layer 18 separates first semiconductor layer 17 from doped AlGaAs layer 19.

Gate 11 and fingers 13 may be formed of any metal which forms a Schottky barrier. Suitable metals include, but are not limited to, gold, nickel, platinum, titanium, aluminum and palladium.

Source ohmic contact 15 is formed from AuGe eutectic with a Ni overlay, alloyed for 5 min at 450° C. In order to allow gate 11 to sit closer to the conducting channel 18, the cap layer (not shown) is completely etched away everywhere but the source.

While the structures of this invention have been shown as comprised of GaAs and GaAlAs, other semiconductor materials can be utilized when desirable and when selectively chosen from groups II-VI or III-V compounds or Group IV.

Figure 3:
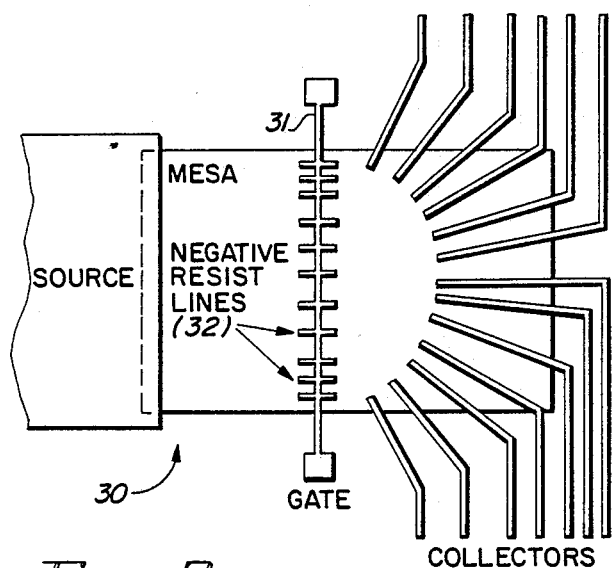
FIG. 3 is a top view of a diffraction grating QUADFET in accordance with the present invention.

The QUADFETs of this invention can be fabricated in at least two ways using electron beam lithography. One way is to blank the electron beam for a short interval while writing the gate pattern in positive resist and then metalizing for subsequent "lift-off" of metal. An alternative two-step process begins by forming a stripe of negative resist across the region to be occupied by the gate. In the second step, a continuous line is written in positive resist to define a short gate 31 (FIG. 31). The "slit" in the gate is the place where the metal rests on the negative resist, off of the semiconductor surface. This technique can be applied to a series of negative resist stripes 32 to allow the fabrication of a diffraction grating, as best shown in FIG. 3. These would yield different diffraction patterns with higher currents, as well as Fresnel zone plate devices.

Ballistic paths on the order of 3 microns have been obtained in GaAs/AlGaAs HEMTs at low temperatures. This is considerably longer than the wavelength of a 1 meV electron, and also longer than the minimum feature sizes achievable by electron beam lithography. Because of this, it is possible to chose the dimensions of the drain region so as to fulfill two complementary conditions: on the one hand, the collectors are close enough that a large fraction of the electrons travel ballistically from slit gate to drain. On the other hand, they are far enough away that a Fraunhofer diffraction pattern is detected. This can be achieved by placing the tips of the collectors one micron from the slit. With a 100 nm pitch, collectors at this distance would yield an angular resolution of about 6 degrees.

In order to observe diffraction effects, the slit width must be comparable to the electron de Broglie wavelength. This in turn requires a treatment of the states that is based directly on the Schrödinger equation. Having placed the collectors in the Fraunhofer regime of distances from the slit, it is assured that the potential which depends on the source-drain bias $V_{DS}$ varies with a characteristic length scale much longer than the wavelength. This permits retention of one simplifying assumption of the usual semiclassical approach to electronic transport. It is possible to neglect the field in the computation of eigenstates. In this regime, the dependence of the current on $V_{DS}$ arises from variation of the state occupation probabilities.

An analysis of diffraction effects in the QUADFET was performed using an approach related to those used in waveguide calculations. First, we solved the Schrödinger equation for an infinitely thin gate with infinite potential and slit width $\alpha$. The completely general momentum-normalized left incident left incident states were written in the form $$\Psi_k(x,y) = \frac{i}{\pi}\sin(k_x x)\exp(ik_y y)\Theta(-x) + \Sigma_k,$$

where $\Theta(u) = \{1 \text{ if } u>0, 0 \text{ if } u \leq 0\}$ is the unit step function, and $\Sigma_k$ is the deviation from the exact wave function for the completely opaque barrier $$\Sigma_k(x,y) = \frac{k_x}{2\pi}\int dq_y F(q_y,k_y;E)\exp(iq_x|x| + iq_y y).$$

Following the method developed by Kriman and Ruden, Phys. Rev. B32, 8013 (1987) and transforming coordinate systems $F(q_y,y_y)$ was evaluated in $$j(\theta) = \int dk_y \int_0^\infty dk_x \, \delta n(k) j(\theta;k).$$

Here, j($\Theta$, $\Theta+d\Theta$), and $$j(\theta;k) = \frac{e\hbar}{\pi m}\cos^2\theta \, k_x^2 \, k^2 |F(k\sin\theta,k_y)|^2$$

is the current density associated with incident wave vector k.

Figure 9:
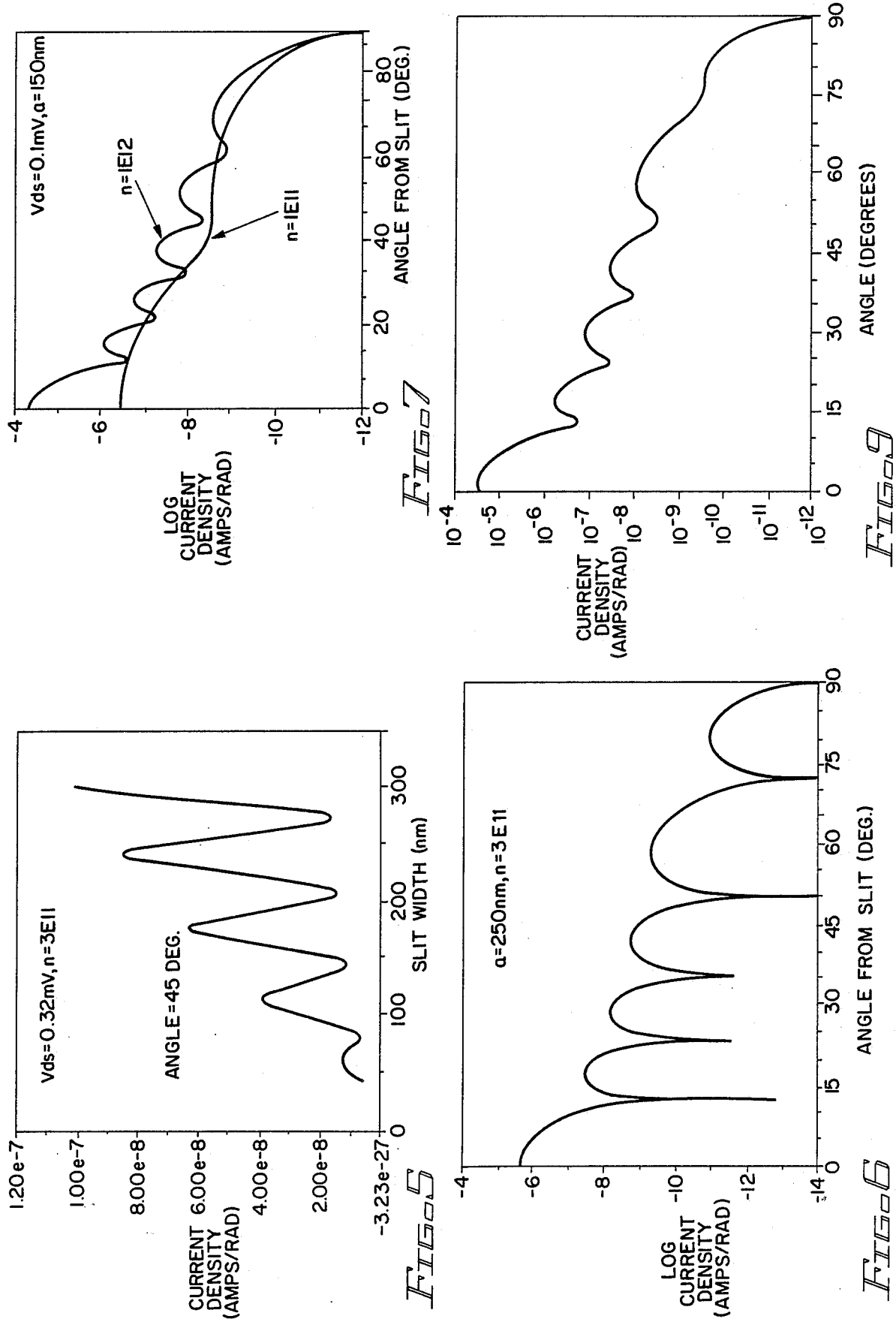
FIG. 9 is a graph depicting the angular current density $j(\Theta)$ for a slit width of 250 nm, an electron density $n=3\times10^{11}$ cm$^{-2}$, and $V_{DS}$ of 0.1 mV.

FIG. 9 shows the result for a slit width of 250 nm, an electron density $n=3\times 10^{11}$ cm$^{-2}$, and $V_{DS}=0.1$ mV. Lobes, characteristic of diffraction, can be seen clearly.

Figure 10:
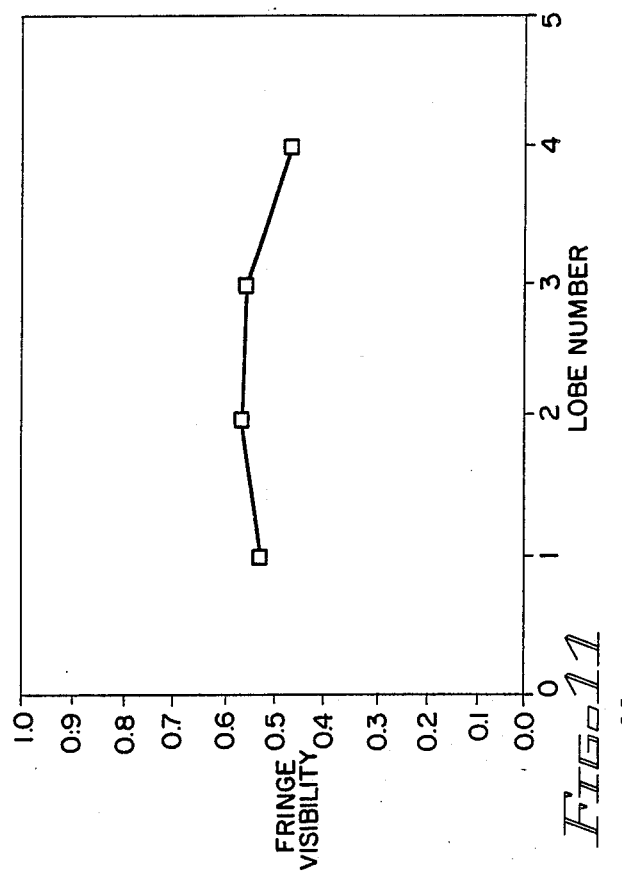
FIG. 10 is a graph depicting the current density $j(\Theta)$ for a slit width of 150 nm, an electron density $n=3\times10^{11}$ cm$^{-2}$, for biases is of (a) 3.16 mV, (b) 1.0 mV, (c) 0.316 mV, and (d) 0.1 mV.

The distribution has a width of roughly $eV_{DS}+kT$ in energy. For a density of $3\times 10^{11}$ cm$^{-2}$ in n-GaAs, $E_F = 11$ meV, compared to $kT = 0.36$ meV (at 4.2K). The electron distribution can therefore be made approximately monochromatic if the bias is kept in the few millivolt range, and for $V_{DS}$ in this range, the temperature dependence due to the width is negligible. Thus, obtaining high temporal coherence is not difficult. Curves in FIG. 10, plotted for different values of the bias, show that for $V_{DS}$ less than about 1 mV, the current density is essentially proportional to bias. At the highest bias, the diffraction lobes are shifted toward smaller angles. This is due to the shorter wavelength of electrons injected at high bias.

The energy scales described above suggest that there is only a weak dependence on temperature below 40K for $V_{DS}$ in the few millivolt range. In practice, scattering will broaden any sharp features that may be exhibited. Nevertheless, studies using hot electron injectors with variable injection energy display a pattern that simplifies the analysis. See M. Heiblum et al., Phys. Rev. Lett., 56, 2954–57 (1986) Over short distances, the scattered (nonballistic) component of the electron distribution quickly assumes a broad distribution of energies, initially very flat over the whole range of energies from zero up to the energy of the ballistic electrons. This kind of scattered component gives rise to a smooth, featureless background, above which the diffraction pattern due to ballistic electrons should be observable. The above discussion applied for $V_{DS}$ less than the threshold for polar optical photon emission (35 mV for GaAs).

Another source of incoherence is the spacial extent of the source. A common measure of coherence is Michelson's fringe visibility. This is defined in terms of the intensities of an adjacent pair of extremes in the diffraction pattern as $$V \equiv \frac{j_{max} - j_{min}}{j_{max} + j_{min}}.$$

The most commonly studied example of spatial coherence effects considers a double slit arrangement where the canonical result is that V depends on a quantity $\phi\alpha/\lambda$ where $\phi$ is the angle subtended by the source as viewed from the diffracting slit, and equals $\pi$ for the device of FIG. 1. Diffraction fringes are clearly discernible only when $\phi\alpha/\lambda$ is small: V = |sinc($\pi\alpha/\lambda$)|(sinc(x-)|sin(x)/x). Applying this classical result to $n=3\times 10^{11}$ cm$^{-2}$ ($\lambda_F=46$ nm) and $\alpha=250$ nm, one finds V<0.02. In fact, this criterion is rather conservative because it is derived in the paraxial approximation of small $\phi$ and relatively large $\alpha/\lambda$. This paraxial approximation allows one to ignore the disinclination factor in Kirchoff's rigorous formulation of the Huygens-Fresnel theory, and to neglect the reduced apparent size of the slit as viewed from an oblique source. Correctly accounting for these neglected factors, as we have done above, is to reduce the contribution of electron waves incident at wide angles, and effectively focuses the incident waves into a source distribution with smaller effective extent $\phi$.

Figure 11:
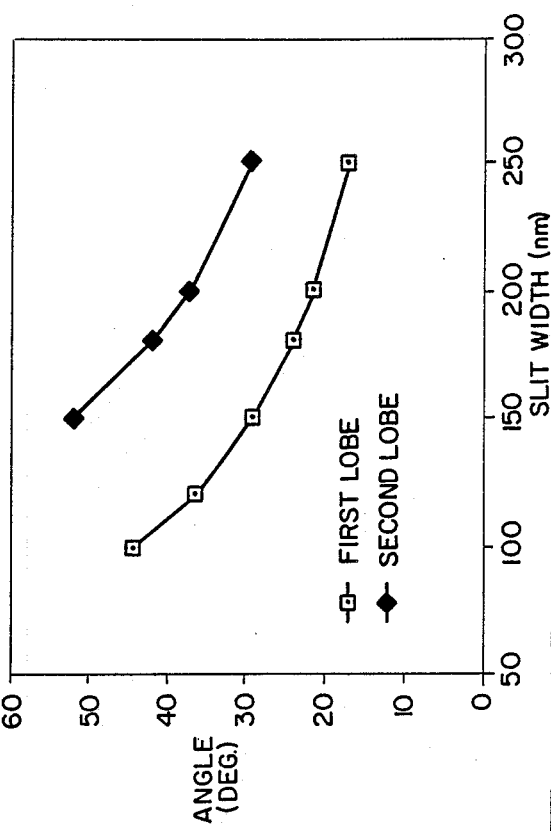
FIG. 11 is a plot of fringe visibilities V for the 250 nm slit.
Figure 12:
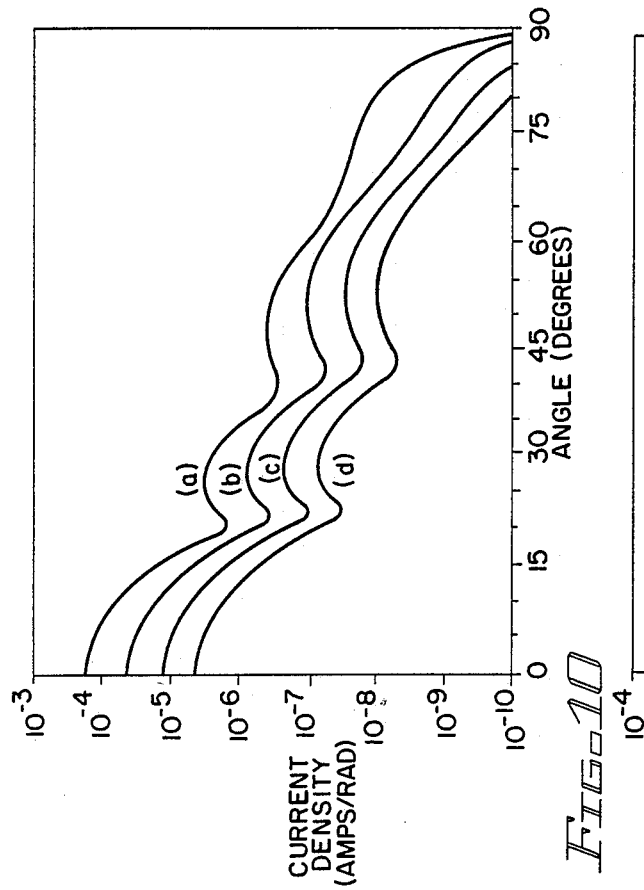
FIG. 12 is a graph depicting current densities for slit widths of (a) 250 nm, (b) 200 nm, (c) 150 nm and (d) 100 nm, for the density and bias conditions of FIG. 1.
Figure 13:
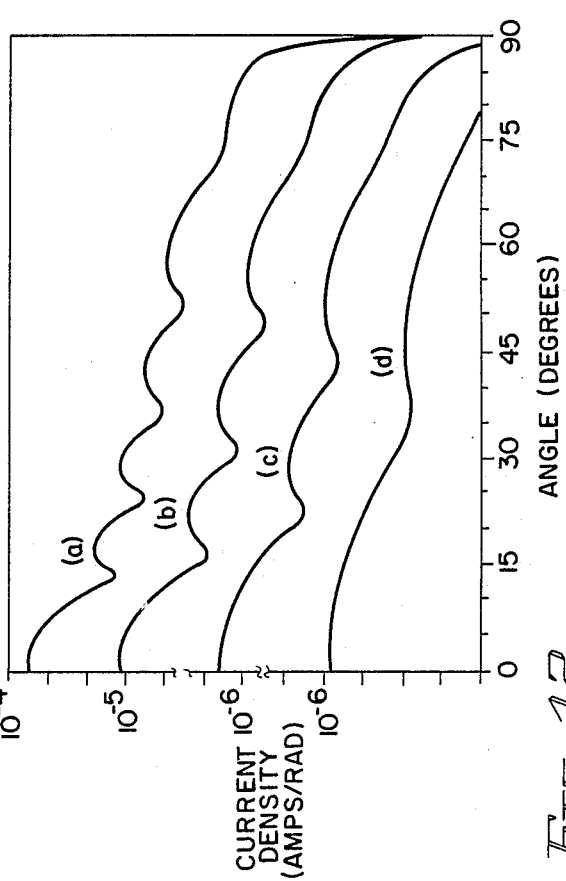
FIG. 13 is a graph depicting positions of the first and second subsidiary current maxima, as functions of the slit width.

For the present small $\alpha/\lambda$ situation, $j_{max}$ varies rapidly from one peak to the next, so V is ambiguously defined. For a conservative estimate, the current density of each minimum is compared with that at the subsequent maximum. As best shown in FIG. 11, the resulting fringe visibilities for the lobes of FIG. 8 are plotted and show a fairly high value of V.

The foregoing description has been made by way of illustration and accordingly all modifications, alterations and changes falling within the spirit and scope of the invention as set forth in the appended claims is meant to be included herein.

The invention claimed is:

1. A novel quantum diffraction field effect transistor which exploits the phenomenon of electron diffraction to produce novel electrical characteristics comprising: a first layer, said first layer being a thin, uniform planar layer of a first type of semiconductive material having an upper surface, a lower surface and opposing ends; a second layer of a second type of semiconductive material; conducting channel means separating said first and second layers of dissimilar semiconductor materials; gate means received and positioned within a central portion of said upper surface of said first layer and communicating with said channel means, said gate means comprising a Shottky metal having a first, centrally disposed slit; a source electrode disposed at one end of the upper surface of said first layer; a drain electrode disposed at the opposing end of the upper surface of said first layer, said drain comprising a series of spaced-apart, forward-biased Schottky contacts or fingers having outwardly disposed tips, said tips arranged on an arc of a circle centered at the slit, so that said source and drain perform the function of the light source and viewing screen of an analogous optical system, respectively.

2. The device of claim 1 wherein said first and second types of semiconductor materials are selected from group II-VI semiconductor materials.

3. The device of claim 1 wherein said first and second types of semiconductor materials are selected from Group III-V semiconductor materials.

4. The device of claim 1 wherein said first layer of semiconductive material is comprised of a relatively thin, generally uniform layer of GaAs and the second layer is comprised of n-AlGaAs.

5. The device of claim 1 additionally comprising a second gate, said second gate spaced apart from said first gate between said first gate and said source.

6. A novel quantum diffraction field effect transistor which exploits the phenomenon of electron diffraction to produce novel electrical characteristics comprising: a first layer, said first layer being a thin, uniform planar layer of a first type of semiconductive material having an upper surface, a lower surface and opposing ends; a second layer of a second type of semiconductive material; conducting channel means separating said first and second layers of dissimilar semiconductor materials; first gate means received and positioned within a central portion of said upper surface of said first layer and communicating with said channel means, said gate means comprising a Shottky metal having a first, centrally disposed slit; second gate means, said second gate spaced apart from said first gate between said first gate and said source, a source electrode disposed at one end of the upper surface of said first layer; a drain electrode disposed at the opposing end of the upper surface of said first layer, said drain comprising a series of spaced-apart, forward-biased Schottky contacts or fingers having outwardly disposed tips, said tips arranged on an arc of a circle centered at the slit, so that said source and drain perform the function of the light source and viewing screen of an analogous optical system, respectively.

7. The device of claim 6 wherein said first and second types of semiconductor materials are selected from group II-VI semiconductor materials.

8. The device of claim 6 wherein said first and second types of semiconductor materials are selected from Group III-V semiconductor materials.

9. The device of claim 6 wherein said first layer of semiconductive material is comprised of a relatively thin, generally uniform layer of GaAs and the second layer is comprised of n-AlGaAs.

10. The device of claim 6 wherein said second gate means is a thin gate running parallel and close to said slit in said first gate means on its source side.

11. The device of claim 6 wherein said second gate means is a collimating gate running parallel and close to said slit in said first gate means on its source side.

12. A novel quantum diffraction field effect transistor which exploits the phenomenon of electron diffraction to produce novel electrical characteristics comprising: a first layer, said first layer being a thin, uniform planar layer of a first type of semiconductive material having an upper surface, a lower surface and opposing ends; a second layer of a second type of semiconductive material; conducting channel means separating said first and second layers of dissimilar semiconductor materials; first gate means received and positioned within a central portion of said upper surface of said first layer and communicating with said channel means, said gate means comprising a Shottky metal diffraction grating; a source electrode disposed at one end of the upper surface of said first layer; a drain electrode disposed at the opposing end of the upper surface of said first layer, said drain comprising a series of spaced-apart, forward-biased Schottky contacts or fingers having outwardly disposed tips, said tips arranged on an arc of a circle centered at the slit, so that said source and drain perform the function of the light source and viewing screen of an analogous optical system, respectively.

13. The device of claim 12 wherein said first and second types of semiconductor materials are selected from group II--VI semiconductor materials.

14. The device of claim 12 wherein said first and second types of semiconductor materials are selected from Group III-V semiconductor materials.

15. The device of claim 12 wherein said first layer of semiconductive material is comprised of a relatively thin, generally uniform layer of GaAs and the second layer is comprised of n-AlGaAs.

* * * * *

UNITED STATES PATENT AND TRADEMARK OFFICE
CERTIFICATE OF CORRECTION

PATENT NO. : 4,962,410
DATED : October 9, 1990
INVENTOR(S) : Gary H. Bernstein et al It is certified that error appears in the above-identified patent and that said Letters Patent is hereby corrected as shown below:

Column 1, line 7

Insert a second paragraph in the section entitled "INTRODUCTION":

---This invention was made with Government support under contract No. N 00014-84-K-0053 awarded by the Department of the Navy.
The Government has certain rights in the invention.---

Signed and Sealed this

Twenty-sixth Day of October, 1993

*Attest:*

BRUCE LEHMAN

*Attesting Officer*   *Commissioner of Patents and Trademarks*